United States Patent
Hsiao et al.

(10) Patent No.: US 10,917,008 B2
(45) Date of Patent: Feb. 9, 2021

(54) OUTPUT STAGE CIRCUIT OF POWER CONVERSION CIRCUIT

(71) Applicant: uPI semiconductor corp., Zhubei (TW)

(72) Inventors: Chih-Wen Hsiao, Zhubei (TW); Chien-Ming Chen, Zhubei (TW)

(73) Assignee: UPI SEMICONDUCTOR CORP., Zhubei (TW)

(*) Notice: Subject to any disclaimer, the term of this patent is extended or adjusted under 35 U.S.C. 154(b) by 0 days.

(21) Appl. No.: 16/731,232

(22) Filed: Dec. 31, 2019

(65) Prior Publication Data
US 2020/0235663 A1  Jul. 23, 2020

(30) Foreign Application Priority Data
Jan. 18, 2019 (CN) .......................... 2019 1 0046531

(51) Int. Cl.
*H03K 5/24* (2006.01)
*H03K 19/20* (2006.01)
*H02M 3/155* (2006.01)
*H02M 1/088* (2006.01)

(52) U.S. Cl.
CPC ........... *H02M 3/155* (2013.01); *H02M 1/088* (2013.01); *H03K 5/24* (2013.01); *H03K 19/20* (2013.01)

(58) Field of Classification Search
CPC ........ H02M 3/155; H02M 1/088; H03K 5/24; H03K 19/20
See application file for complete search history.

(56) References Cited

U.S. PATENT DOCUMENTS

| | | | |
|---|---|---|---|
| 6,714,067 B1* | 3/2004 | Farrenkopf | H02M 3/155 327/108 |
| 8,169,208 B2* | 5/2012 | Kung | H02M 3/158 323/285 |
| 8,354,831 B2 | 1/2013 | Wrathall | |
| 2012/0229165 A1* | 9/2012 | Tseng | H03K 19/00361 326/82 |

FOREIGN PATENT DOCUMENTS

CN    204089754 U    1/2015

* cited by examiner

*Primary Examiner* — John W Poos
(74) *Attorney, Agent, or Firm* — McClure, Qualey & Rodack, LLP

(57) ABSTRACT

An output stage circuit of a power conversion circuit includes a first power switch, a driving circuit, a first current source, a second current source and a combining circuit. The first power switch is coupled to a second terminal of a bootstrap capacitor. The driving circuit is coupled to the first terminal of the bootstrap capacitor and the first power switch and provides a control signal to the first power switch. The first current source generates a first current according to the control signal. The second current source generates a second current according to a reference voltage which is a first voltage at the first terminal or a second voltage at the second terminal. The combining circuit, coupled to the driving circuit, the first current source and the second current source, generates a switch operation indicating signal to the driving circuit according to the first current and second current.

11 Claims, 5 Drawing Sheets

OUTPUT STAGE CIRCUIT OF POWER CONVERSION CIRCUIT

BACKGROUND OF THE INVENTION

1. Field of the Invention

The invention relates to power conversion; in particular, to an output stage circuit of a power conversion circuit.

2. Description of the Prior Art

Generally speaking, in a conventional buck-type power conversion circuit, its determination circuit usually determines a timing of turning on a lower-bridge switch in an output stage according to whether an upper-bridge switch in the output stage is turned off. The conventional basis of determining whether the upper-bridge switch is turned off is to observe a phase voltage of a phase node between the upper-bridge switch and the lower-bridge switch. When the phase voltage drops below a default voltage, it is determined that the upper-bridge switch is turned off and a switch operation indicating signal is transmitted to a power conversion driver.

However, since a control signal of the upper-bridge switch operates under a high-voltage (for example, 12V), the area of the transistors in the determination circuit should be large, which results in a relatively large impedance and parasitic capacitance and a relatively large stored charge. Therefore, it is necessary to wait for the charge stored in the components to flow out when performing detection, and then the determination circuit located below it can determine that the upper-bridge switch is turned off. In addition, since the transistors in the determination circuit are high-impedance points, its resistance-capacitance product is high, resulting in a slower circuit response.

According to the practical simulation results, it can be known that the period from the time that the control signal of the upper-bridge switch changes from high-level to low-level to the time that the conventional determination circuit determines that the upper-bridge switch is turned off is too long (about 0.1 us). This problem needs urgent improvement.

SUMMARY OF THE INVENTION

Therefore, the invention provides an output stage circuit of a power conversion circuit to effectively solve the above-mentioned problems in the prior art.

An embodiment of the invention is an output stage circuit of a power conversion circuit. In this embodiment, the output stage circuit is coupled to a bootstrap capacitor having a first terminal and a second terminal. The output stage circuit includes a first power switch, a driving circuit, a first current source, a second current source and a combining circuit. The first power switch is coupled to the second terminal of the bootstrap capacitor. The driving circuit is coupled to the first terminal of the bootstrap capacitor and the first power switch and configured to provide a control signal to the first power switch. The first current source is configured to generate a first current according to the control signal. The second current source is configured to generate a second current according to a reference voltage, wherein the reference voltage is one of a first voltage at the first terminal and a second voltage at the second terminal. The combining circuit is coupled to the driving circuit, the first current source and the second current source and configured to generate a switch operation indicating signal to the driving circuit according to the first current and second current.

In an embodiment of the invention, the driving circuit provides the control signal to control the first power switch according to the switch operation indicating signal.

In an embodiment of the invention, the output stage circuit further includes a second power switch. The second power switch is coupled to the second terminal of the bootstrap capacitor and the driving circuit and controlled by the driving circuit according to the switch operation indicating signal.

In an embodiment of the invention, the combining circuit includes a node. The node is coupled to the first current source and the second current source and configured to generate a node voltage as the switch operation indicating signal according to the first current and the second current and then output the switch operation indicating signal to the driving circuit.

In an embodiment of the invention, the combining circuit includes a node, a comparator and an OR gate. The node is coupled to the first current source and the second current source and configured to generate a node voltage according to the first current and the second current. The comparator is configured to compare the second voltage with a ground voltage to generate a comparison signal. The OR gate is coupled to the node, the comparator and the driving circuit respectively and configured to output the switch operation indicating signal to the driving circuit according to the node voltage and the comparison signal.

In an embodiment of the invention, the first current source includes a resistor and a current mirror circuit. The resistor is coupled to the control signal and configured to generate the first current signal. The current mirror circuit is coupled between the resistor and the combining circuit and configured to copy the first current signal and then provide the copied first current signal to the combining circuit.

In an embodiment of the invention, the second current source includes a transistor, a resistor, a current mirror circuit and another current mirror circuit. The transistor is coupled to the reference voltage. The resistor is coupled to the transistor and configured to generate the second current signal. The current mirror circuit is coupled to the resistor and configured to copy the second current signal and then output the copied second current signal. The another current mirror circuit is coupled between the current mirror circuit and the combining circuit and configured to reverse a direction of the second current signal and then provide the reversed second current signal to the combining circuit.

In an embodiment of the invention, the first current source includes a resistor and a current mirror circuit. The resistor is coupled to the reference voltage and configured to generate the first current signal. The current mirror circuit is coupled between the resistor and the combining circuit and configured to copy the first current signal and then provide the copied first current signal to the combining circuit.

In an embodiment of the invention, the second current source includes a transistor, a resistor, a current mirror circuit and another current mirror circuit. The transistor is coupled to the control signal. The resistor is coupled to the transistor and configured to generate the second current signal. The current mirror circuit is coupled to the resistor and configured to copy the second current signal and then output the copied second current signal. The another current mirror circuit is coupled between the current mirror circuit and the combining circuit and configured to reverse a direction of the second current signal and then provide the reversed second current signal to the combining circuit.

In an embodiment of the invention, the first current source includes a resistor, a transistor, a current mirror circuit and another current mirror circuit. The resistor is coupled to the control signal and configured to generate the first current signal. The transistor is coupled to the resistor. The current mirror circuit is coupled to the transistor and configured to copy the first current signal and then output the copied first current signal. The another current mirror circuit is coupled between the current mirror circuit and the combining circuit and configured to reverse a direction of the first current signal and then provide the reversed first current signal to the combining circuit.

In an embodiment of the invention, the second current source includes a resistor and a current mirror circuit. The resistor is coupled to the reference voltage and configured to generate the second current signal. The current mirror circuit is coupled between the resistor and the combining circuit and configured to copy the second current signal and then provide the copied second current signal to the combining circuit.

Compared to the prior art, the output stage circuit applied to the power conversion circuit in the invention can achieve the following effects:

(1) determining whether the upper-bridge switch (the first power switch) in the output stage circuit is turned off by using a current combination method can greatly reduce the determination time; and (2) reducing the use of high-voltage components to save the chip area.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
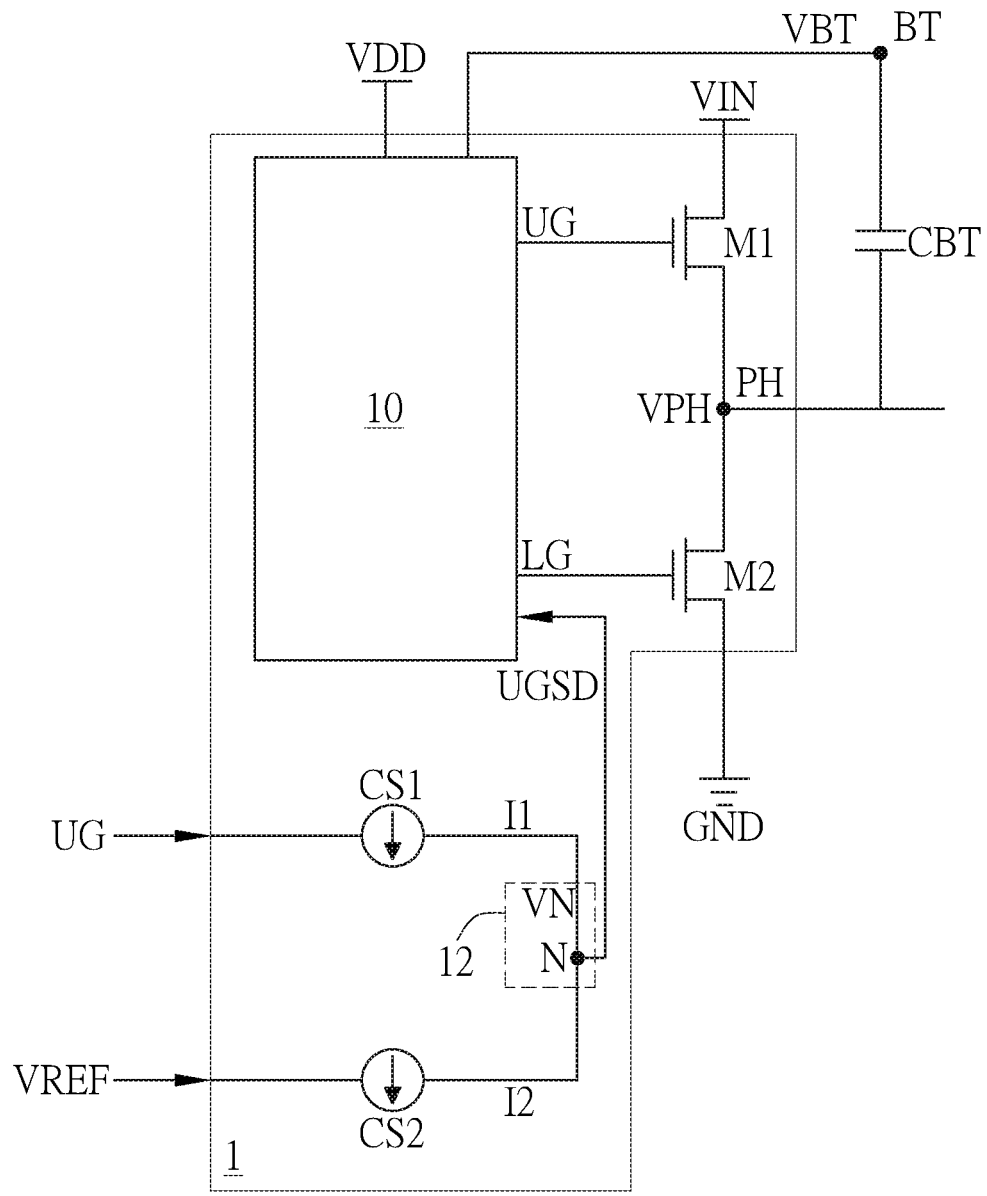
FIG. 1 illustrates a schematic diagram of the output stage circuit in an embodiment of the invention.

Exemplary embodiments of the invention are referenced in detail now, and examples of the exemplary embodiments are illustrated in the drawings. Further, the same or similar reference numerals of the elements/components in the drawings and the detailed description of the invention are used on behalf of the same or similar parts.

A preferred embodiment of the invention is an output stage circuit. In this embodiment, the output stage circuit is applied to a power conversion circuit and the output stage circuit is coupled to a bootstrap capacitor, but not limited to this.

Please refer to FIG. 1. FIG. 1 illustrates a schematic diagram of an output stage circuit in this embodiment. As shown in FIG. 1, the output stage circuit 1 is coupled to a bootstrap capacitor CBT. The bootstrap capacitor CBT has a first terminal BT and a second terminal PH. The output stage circuit 1 includes a first power switch M1, a second power switch M2, a driving circuit 10, a first current source CS1, a second current source CS2 and a combining circuit 12.

The first power switch M1 and the second power switch M2 are coupled in series between an input voltage VIN and a ground terminal GND, and the first power switch M1 and the second power switch M2 are both coupled to the second terminal PH of the bootstrap capacitor CBT. The first terminal BT of the bootstrap capacitor CBT is coupled to the driving circuit 10. The control terminals of the first power switch M1 and the second power switch M2 are both coupled to the driving circuit 10, and the driving circuit 10 provides the first control signal UG and the second control signal LG to the first power switch M1 and the second power switch M2 respectively.

The first current source CS1 is coupled between the first control signal UG and the combining circuit 12, and the first current source CS1 generates a first current I1 to the combining circuit 12 according to the first control signal UG.

The second current source CS2 is coupled between the reference voltage VREF and the combining circuit 12, and the second current source CS2 generates a second current I2 to the combining circuit 12 according to the reference voltage VREF. In practical applications, the reference voltage VREF can be a first voltage VBT of the first terminal BT of the bootstrap capacitor CBT, or a second voltage VPH of the second terminal PH of the bootstrap capacitor CBT.

The combining circuit 12 is coupled to the driving circuit 10, the first current source CS1 and the second current source CS2 respectively, and the combining circuit 12 generates a switch operation indicating signal UGSD to the driving circuit 10 according to the first current I1 and the second current I2.

When the driving circuit 10 receives the switch operation indicating signal UGSD, the driving circuit 10 provides the first control signal UG and the second control signal LG to control the first power switch M1 and the second power switch M2 respectively according to the switch operation indicating signal UGSD.

In this embodiment, the combining circuit 12 can include a node N. The node N is coupled to the first current source CS1 and the second current source CS2, and the node N generates a node voltage VN as the switch operation indicating signal UGSD according to the first current I1 and the second current I2 and then outputs it to the driving circuit 10.

Figure 2:
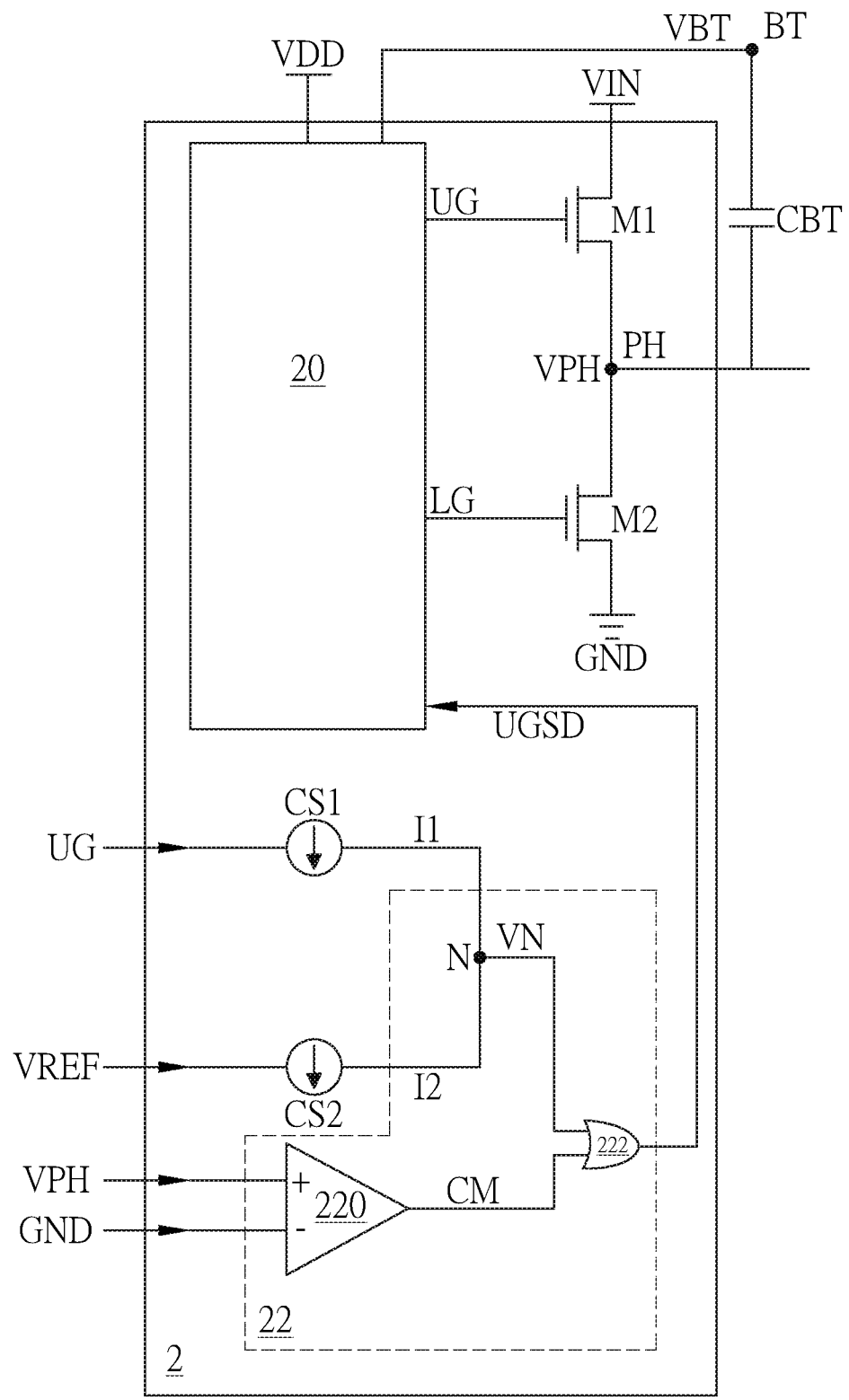
FIG. 2 illustrates a schematic diagram of the output stage circuit in another embodiment of the invention.

Next, please refer to FIG. 2. FIG. 2 illustrates a schematic diagram of the output stage circuit in another embodiment. As shown in FIG. 2, the output stage circuit 2 is coupled to a bootstrap capacitor CBT. The bootstrap capacitor CBT has a first terminal BT and a second terminal PH. The output stage circuit 2 includes a first power switch M1, a second power switch M2, a driving circuit 20, a first current source CS1, a second current source CS2 and a combining circuit 22.

The output stage circuit 2 in this embodiment is different from the output stage circuit 1 in the foregoing embodiment in that the combining circuit 22 of the output stage circuit 2 includes a node N, a comparator 220 and an OR gate 222.

The node N is coupled to the first current source CS1, the second current source CS2 and the OR gate 222 respectively, and the node N generates a node voltage VN to the OR gate 222 according to the first current I1 provided by the first current source CS1 and the second current I2 provided by the second current source CS2.

Two input terminals + and − of the comparator 220 are coupled to the second voltage VPH of the second terminal PH of the bootstrap capacitor CBT and the ground voltage GND respectively, and an output terminal of the comparator 220 is coupled to the OR gate 222. The comparator 220 compares the second voltage VPH with the ground voltage GND to generate a comparison signal CM to the OR gate 222.

The OR gate 222 is coupled to the node N, the comparator 220, and the driving circuit 20 respectively, and the OR gate 222 outputs a switch operation indicating signal UGSD to the driving circuit 20 according to the node voltage VN and the comparison signal CM.

When the driving circuit 20 receives the switch operation indicating signal UGSD, the driving circuit 20 provides the first control signal UG and the second control signal LG to control the first power switch M1 and the second power switch M2 respectively according to the switch operation indicating signal UGSD.

In practical applications, the first current source CS1 and the second current source CS2 in the output stage circuit of the invention can have different circuit structures, which are respectively described through the following embodiments.

Figure 3A:
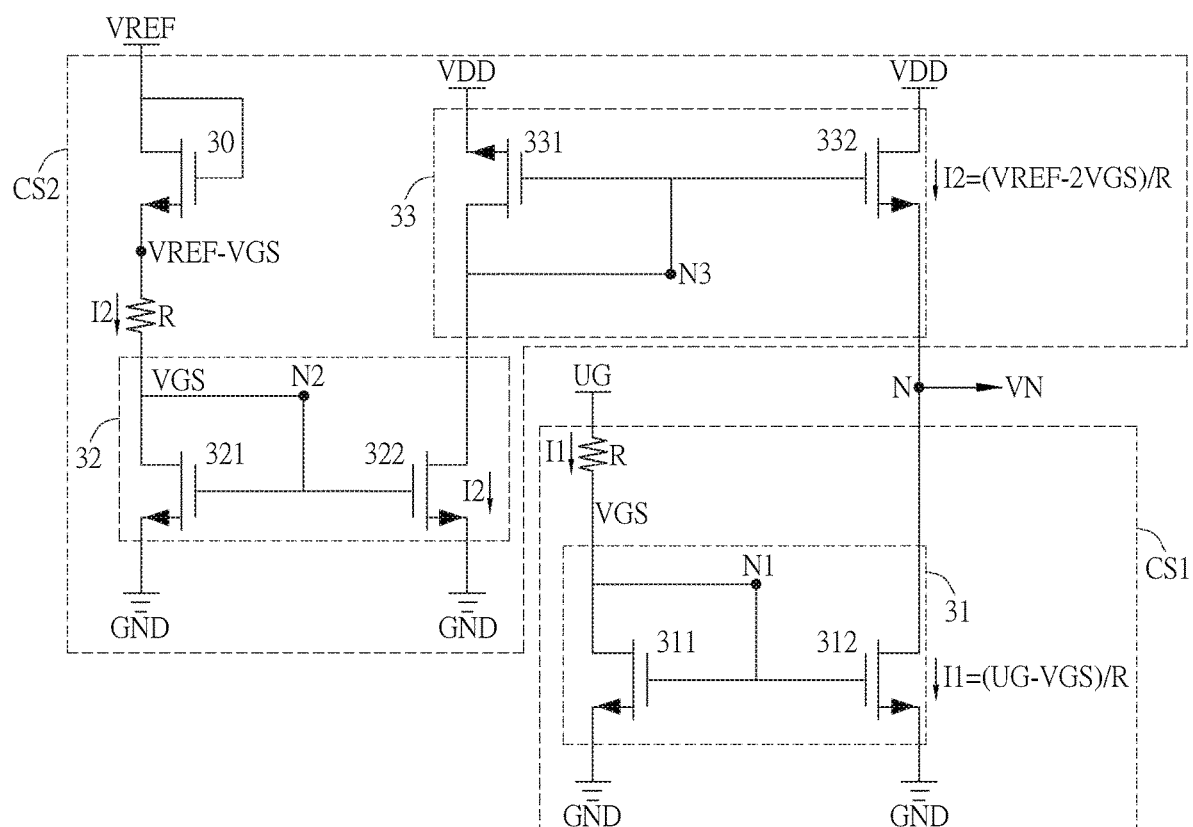
FIG. 3A illustrates an embodiment that the resistor R of the first current source CS1 is coupled to the first control signal UG and the transistor 30 of the second current source CS2 is coupled to the reference voltage VREF.

Please refer to FIG. 3A. FIG. 3A illustrates an embodiment of the first current source CS1 and the second current source CS2.

As shown in FIG. 3A, the first current source CS1 and the second current source CS2 are both coupled to the node N. The first current source CS1 includes a resistor R and a current mirror circuit 31. The resistor R is coupled to the first control signal UG and generates a first current signal I1. The current mirror circuit 31 is coupled to the resistor R, the node N and the ground voltage GND respectively, and the current mirror circuit 31 copies the first current signal I1 and then provides the copied first current signal I1 to the node N.

The current mirror circuit 31 includes transistors 311 and 312 whose gates are coupled with each other. The transistor 311 is coupled between the resistor R and the ground voltage GND. The transistor 312 is coupled between the node N and the ground voltage GND. The first node N1 coupled between the gate and the source of the transistor 311 has a gate-source voltage VGS. Therefore, the first current signal I1 flowing through the resistor R=(the first control signal UG−the gate-source voltage VGS)/the resistance R, that is, I1=(UG−VGS)/R.

The second current source CS2 includes a transistor 30, a resistor R, a current mirror circuit 32 and a current mirror circuit 33. The transistor 30 is coupled to the reference voltage VREF. The resistor R is coupled to the transistor 30 and generates a second current signal I2. The current mirror circuit 32 is coupled between the resistor R and the ground voltage GND, and the current mirror circuit 32 copies the second current signal I2 and then outputs the \copied second current signal I2.

The current mirror circuit 32 includes transistors 321 and 322 whose gates are coupled with each other. The transistor 321 is coupled between the resistor R and the ground voltage GND. The transistor 322 is coupled between the current mirror circuit 33 and the ground voltage GND. The second node N2 coupled between the gate and the source of the transistor 321 has a gate-source voltage VGS. The voltage between the transistor 30 and the resistor R is the reference voltage VREF minus the gate-source voltage VGS of the transistor 30. Therefore, the second current signal I2 flowing through the resistor R=(the reference voltage VREF−2*the gate-source voltage VGS)/the resistor R, that is, I2=(VREF−2*VGS)/R.

The current mirror circuit 33 is coupled to the power supply voltage VDD, the current mirror circuit 32 and the node N respectively, and the current mirror circuit 33 reverses the direction of the second current signal I2 and then provides the reversed second current signal I2 to the node N. The current mirror circuit 33 includes transistors 331 and 332 whose gates are coupled with each other. The transistor 331 is coupled between the power supply voltage VDD and the current mirror circuit 32. The transistor 332 is coupled between the power supply voltage VDD and the node N. The third node N3 coupled between the gate and the source of the transistor 331 has a gate-source voltage VGS.

Therefore, when the node N receives the first current signal I1 and the second current signal I2 respectively, the node current IN=[(the reference voltage VREF−the Gate-source voltage VGS)−the first control signal UG)]/the resistor R, that is, IN=[(VREF−VGS)−UG)]/R.

When the node voltage VN of the node N changes from low-level to high-level, it represents that the node current IN is greater than 0, that is, the voltage of the first control signal UG changes from greater than (VREF−VGS) to less than (VREF−VGS). It can be seen that the first power switch M1 is turned off. When the node voltage VN of the node N changes from high-level to low-level, it represents that the first control signal UG changes from less than (VREF−VGS) to greater than (VREF−VGS), so it can be seen that the first power switch M1 is turned on. Thereby, the timing of turning on the second power switch M2 can be determined according to whether the first power switch M1 is turned off.

In practical applications, the reference voltage VREF can be the first voltage VBT of the first terminal BT of the bootstrap capacitor CBT, or the second voltage VPH of the second terminal PH of the bootstrap capacitor CBT. In addition, in this circuit, the first node N1, the second node N2 and the third node N3 encountered during the transition from high-voltage to low-voltage are not high-impedance points, and only the node N is a high-impedance point, so that the product of the resistance and the capacitance is relatively low, allowing the circuit to respond faster than the prior arts.

Figure 3B:
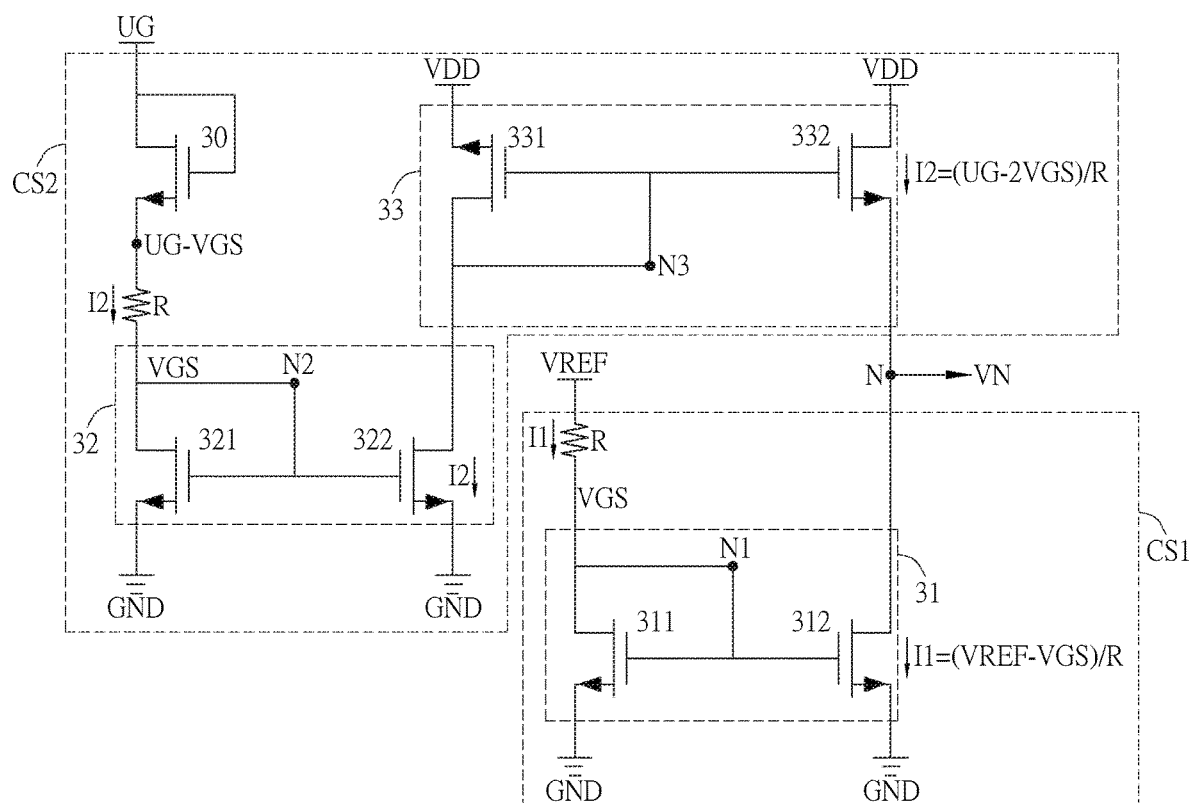
FIG. 3B illustrates an embodiment that the resistor R of the first current source CS1 is coupled to the reference voltage VREF and the transistor 30 of the second current source CS2 is coupled to the first control signal UG.

Please refer to 3B. FIG. 3B illustrates another embodiment of the first current source CS1 and the second current source CS2.

FIG. 3B is different from FIG. 3A in that the resistor R of the first current source CS1 is coupled to the reference voltage VREF and the transistor 30 of the second current source CS2 is coupled to the first control signal UG. Therefore, the first current signal I1=(the reference voltage VREF−the gate-source voltage VGS)/the resistor R, that is, I1=(VREF−VGS)/R. The second current signal I2=(the first control signal UG−2*the gate-source voltage VGS)/the resistor R; that is, I2=(UG−2*VGS)/R.

When the node N receives the first current signal I1 and the second current signal I2 respectively, the node current IN obtained by subtracting the first current signal I1 from the second current signal I2 is [the first control signal UG−(the reference voltage VREF+the gate-source voltage VGS)]/the resistor R; that is, IN=[UG−(VREF+VGS)]/R.

When the node voltage VN of the node N changes from low-level to high-level, it represents that the node current IN is greater than 0; that is, the voltage of the first control signal UG changes from less than (VREF+VGS) to greater than (VREF+VGS), so that it can be seen that the first power switch M1 is turned on. When the node voltage VN of the node N changes from high-level to low-level, it represents that the first control signal UG changes from greater than (VREF+VGS) to less than (VREF+VGS), so that it can be seen that the first power switch M1 is turned off. Thereby, the timing of turning on the second power switch M2 can be determined according to whether the first power switch M1 is turned off.

Figure 4:
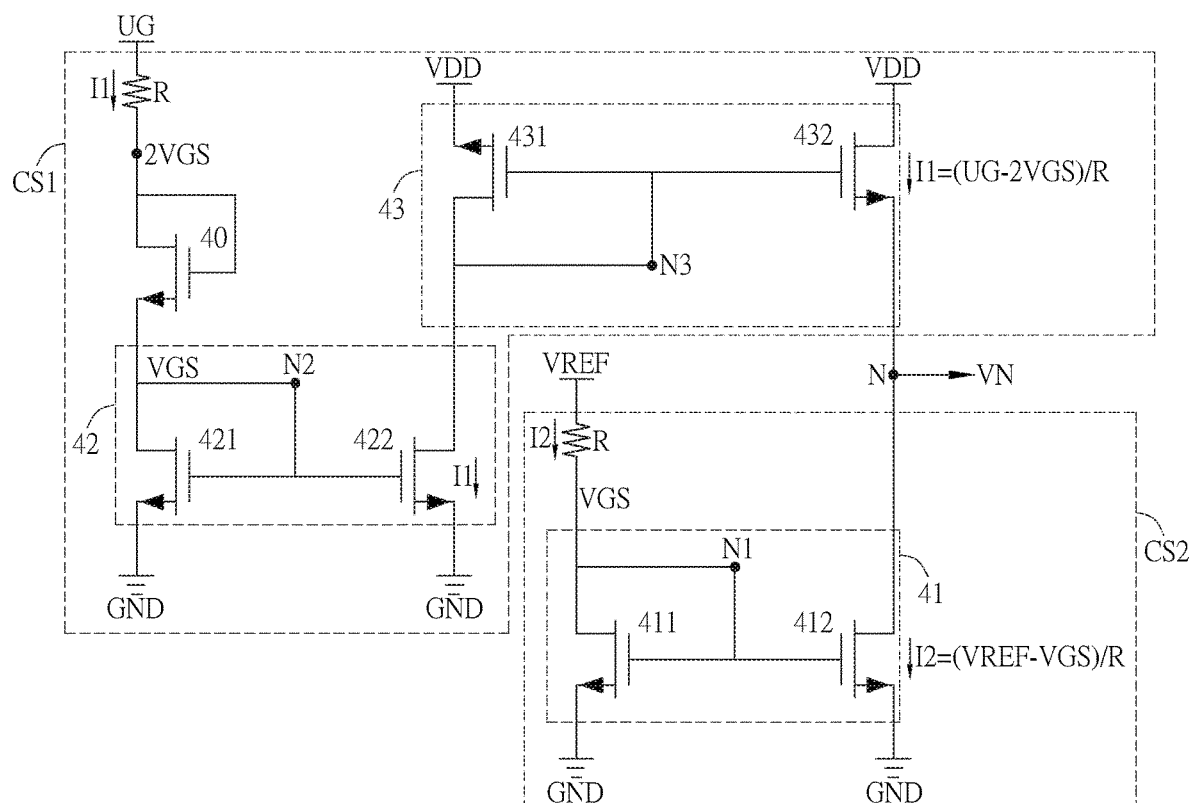
FIG. 4 illustrates an embodiment that the resistor R of the first current source CS1 is coupled to the first control signal UG and the resistor R of the second current source CS2 is coupled to the reference voltage VREF.

Please refer to FIG. 4. FIG. 4 illustrates another embodiment of the first current source CS1 and the second current source CS2.

As shown in FIG. 4, the first current source CS1 and the second current source CS2 are both coupled to the node N. The first current source CS1 includes a resistor R, a transistor 40, a current mirror circuit 42 and a current mirror circuit 43. The resistor R is coupled to the first control signal UG and generates a first current signal I1. The transistor 40 is coupled between the resistor R and the current mirror circuit 42. The current mirror circuit 42 is coupled between the transistor 40 and the ground voltage GND, and the current mirror circuit 42 copies the first current signal I1 and then outputs the copied first current signal I1.

The current mirror circuit 42 includes transistors 421 and 422 whose gates are coupled with each other. The transistor 421 is coupled between the transistor 40 and the ground voltage GND. The transistor 422 is coupled between the current mirror circuit 43 and the ground voltage GND. The second node N2 coupled between the gate and the source of the transistor 421 has a gate-source voltage VGS and the voltage between the transistor 40 and the resistor R is (2*the gate-source voltage VGS). Therefore, the first current signal I1 flowing through the resistor R=(the first control signal UG−2*the gate-source voltage VGS)/the resistor R, that is, I1=(UG−2*VGS)/R.

The current mirror circuit 43 is coupled to the power supply voltage VDD respectively, the current mirror circuit 42 and the node N, and the current mirror circuit 43 is provided to the node N after reversing the direction of the first current signal I1. The current mirror circuit 43 includes transistors 431 and 432 whose gates are coupled with each other. The transistor 431 is coupled between the power supply voltage VDD and the current mirror circuit 42. The transistor 432 is coupled between the power supply voltage VDD and the node N. The third node N3 coupled between the gate and the source of the transistor 431 has a gate-source voltage VGS.

The second current source CS2 includes a resistor R and a current mirror circuit 41. The resistor R is coupled to the reference voltage VREF and generates a second current signal I2. The current mirror circuit 41 is coupled to the resistor R, the node N and the ground voltage GND respectively, and the current mirror circuit 41 copies the second current signal I2 and then provides the copied second current signal I2 to the node N.

The current mirror circuit 41 includes transistors 411 and 412 whose gates are coupled with each other. The transistor 411 is coupled between the resistor R and the ground voltage GND. The transistor 412 is coupled between the node N and the ground voltage GND. The first node N1 coupled between the gate and the source of the transistor 411 has a gate-source voltage VGS. Therefore, the first current signal I2 flowing through the resistor R=(the reference voltage VREF−the gate-source voltage VGS)/the resistor R, that is, I2=(VREF−VGS)/R.

When the node N receives the first current signal I1 and the second current signal I2 respectively, the node current IN obtained by subtracting the first current signal I1 from the second current signal I2 is [the first control signal UG−(the reference voltage VREF+the gate-source voltage VGS)]/the resistor R; that is, IN=[UG−(VREF+VGS)]/R.

When the node voltage VN of the node N changes from low-level to high-level, it represents that the node current IN is greater than 0; that is, the voltage of the first control signal UG changes from less than (VREF+VGS) to greater than (VREF+VGS), so it can be seen that the first power switch M1 is turned on. When the node voltage VN of the node N changes from high-level to low-level, it represents that the first control signal UG changes from greater than (VREF+VGS) to less than (VREF+VGS), so that it can be seen that the first power switch M1 is turned off. Thereby, the timing of turning on the second power switch M2 can be determined according to whether the first power switch M1 is turned off.

In practical applications, the reference voltage VREF can be the first voltage VBT of the first terminal BT of the bootstrap capacitor CBT, or the second voltage VPH of the second terminal PH of the bootstrap capacitor CBT. In addition, in this circuit, the first node N1, the second node N2 and the third node N3 encountered during the transition from high-voltage to low-voltage are not high-impedance points, and only the node N is a high-impedance point, so that the RC value is relatively low, making the circuit response faster than the prior art. Moreover, according to different requirements, the positions of the first control signal UG and the reference voltage VREF can be interchanged, but not limited to this.

According to practical simulation results, it can be known that the time period from the time that the first control signal UG changes from high-level to low-level to the time that the output stage circuit of the invention determines that the first power switch is turned off is less than 0.01 us, which is far less than the time (about 0.1 us) taken by the output stage circuit of the prior arts, so that the determination time can be greatly reduced.

Compared to the prior art, the output stage circuit applied to the power conversion circuit in the invention can achieve the following effects:

(1) determining whether the upper-bridge switch (the first power switch) in the output stage circuit is turned off by using a current combination method can greatly reduce the determination time; and (2) reducing the use of high-voltage components to save the chip area.

What is claimed is:

1. An output stage circuit of a power conversion circuit, coupled to a bootstrap capacitor having a first terminal and a second terminal, the output stage circuit comprising:
   a first power switch, coupled to the second terminal of the bootstrap capacitor;
   a driving circuit, coupled to the first terminal of the bootstrap capacitor and the first power switch and configured to provide a control signal to the first power switch;
   a first current source, configured to generate a first current according to the control signal;

a second current source, configured to generate a second current according to a reference voltage, wherein the reference voltage is one of a first voltage at the first terminal and a second voltage at the second terminal; and a combining circuit, coupled to the driving circuit, the first current source and the second current source and configured to generate a switch operation indicating signal to the driving circuit according to the first current and second current.

2. The output stage circuit of claim 1, wherein the driving circuit provides the control signal to control the first power switch according to the switch operation indicating signal.

3. The output stage circuit of claim 1, further comprising:
a second power switch, coupled to the second terminal of the bootstrap capacitor and the driving circuit and controlled by the driving circuit according to the switch operation indicating signal.

4. The output stage circuit of claim 1, wherein the combining circuit comprises:
a node, coupled to the first current source and the second current source and configured to generate a node voltage as the switch operation indicating signal according to the first current and the second current and then output the switch operation indicating signal to the driving circuit.

5. The output stage circuit of claim 1, wherein the combining circuit comprises:
a node, coupled to the first current source and the second current source and configured to generate a node voltage according to the first current and the second current;
a comparator, configured to compare the second voltage with a ground voltage to generate a comparison signal; and
an OR gate, coupled to the node, the comparator and the driving circuit respectively and configured to output the switch operation indicating signal to the driving circuit according to the node voltage and the comparison signal.

6. The output stage circuit of claim 1, wherein the first current source comprises:
a resistor, coupled to the control signal and configured to generate the first current signal; and
a current mirror circuit, coupled between the resistor and the combining circuit and configured to copy the first current signal and then provide the copied first current signal to the combining circuit.

7. The output stage circuit of claim 1, wherein the second current source comprises:
a transistor, coupled to the reference voltage;
a resistor, coupled to the transistor and configured to generate the second current signal;
a current mirror circuit, coupled to the resistor and configured to copy the second current signal and then output the copied second current signal; and
another current mirror circuit, coupled between the current mirror circuit and the combining circuit and configured to reverse a direction of the second current signal and then provide the reversed second current signal to the combining circuit.

8. The output stage circuit of claim 1, wherein the first current source comprises:
a resistor, coupled to the reference voltage and configured to generate the first current signal; and
a current mirror circuit, coupled between the resistor and the combining circuit and configured to copy the first current signal and then provide the copied first current signal to the combining circuit.

9. The output stage circuit of claim 1, wherein the second current source comprises:
a transistor, coupled to the control signal;
a resistor, coupled to the transistor and configured to generate the second current signal;
a current mirror circuit, coupled to the resistor and configured to copy the second current signal and then output the copied second current signal; and
another current mirror circuit, coupled between the current mirror circuit and the combining circuit and configured to reverse a direction of the second current signal and then provide the reversed second current signal to the combining circuit.

10. The output stage circuit of claim 1, wherein the first current source comprises:
a resistor, coupled to the control signal and configured to generate the first current signal;
a transistor, coupled to the resistor;
a current mirror circuit, coupled to the transistor and configured to copy the first current signal and then output the copied first current signal; and
another current mirror circuit, coupled between the current mirror circuit and the combining circuit and configured to reverse a direction of the first current signal and then provide the reversed first current signal to the combining circuit.

11. The output stage circuit of claim 1, wherein the second current source comprises:
a resistor, coupled to the reference voltage and configured to generate the second current signal; and
a current mirror circuit, coupled between the resistor and the combining circuit and configured to copy the second current signal and then provide the copied second current signal to the combining circuit.

* * * * *